METHOD OF FORMING A SEMICONDUCTOR DEVICE BY DIFFUSING AND ALLOYING

Filed Sept. 15, 1964

INVENTOR.
ARTHUR D. FALLON
BY
ATTORNEY

United States Patent Office 3,388,012

Patented June 11, 1968

3,388,012

METHOD OF FORMING A SEMICONDUCTOR DEVICE BY DIFFUSING AND ALLOYING

Arthur Dennis Fallon, Long Branch, N.J., assignor to The Bendix Corporation, Eatontown, N.J., a corporation of Delaware Filed Sept. 15, 1964, Ser. No. 396,591

3 Claims. (Cl. 148—177)

ABSTRACT OF THE DISCLOSURE

A method of fabricating semiconductor devices in which diffusion is made on both sides and the collector is alloyed in beyond the diffused region and the diffused region adjacent to the periphery of the collector is removed.

The present invention relates to semiconductor devices and more particularly to a transistor and the method of making the same.

Presently diffused alloy transistors are prepared by diffusing a wafer of semiconductor material on both sides. It then is necessary to lap or etch off the diffused material from one side. This makes it necessary to mark in order to know which is the diffused side in order that the collector may be alloyed to the other side in order to provide a high resistivity, nongraded area into which a collector can be alloyed.

In the present invention the diffused region is not removed. The collector is alloyed in beyond the diffused region and the diffused region adjacent to the periphery of the collector is removed.

It is an object of the invention to provide an improved semiconductor device.

Another object of the invention is to provide a novel method for fabricating a transistor.

Another object of the invention is to provide improved means for fabricating a semiconductor device.

Another object of the invention is to provide an improved fast switching germanium power transistor.

Another object of the invention is to provide a new fabrication technique for a semiconductor device.

The above and other objects and features of the invention will appear more fully hereinafter from a consideration of the following description taken in connection with the accompanying drawing, wherein two embodiments are illustrated by way of examples.

Figure 1A:
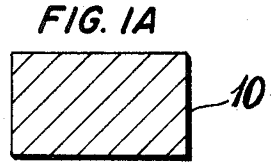
FIGURE 1 is a diagrammatical representation of the steps normally used in fabricating a transistor.

Presently diffused alloy transistors are processed using the steps as set forth in FIGURE 1 and in step 1 FIGURE 1A a slice of semiconductor material is indicated generally by the numeral 10 and for the purpose of illustrations is a slice of N type germanium having a thickness of 16.5 mils. It is understood, however, that other types of semiconductors could be used, such as silicon. Also other thicknesses could be used. The ones given are for purposes of illustration and not as a limitation.

Figure 1B:
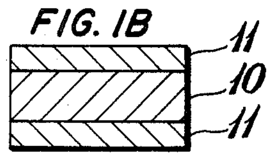

In step 2 FIGURE 1B an N+ doping material, for example, antimony, is diffused to a predetermined depth in both surfaces of the slice 10 forming N+ layers 11 therein.

For the purpose of illustration, the layers 11 may penetrate the slice 10 to a depth of 3.5 mils. The diffusion may be the vapor, paint-on or any of the conventional diffusion techniques.

Figure 1C:
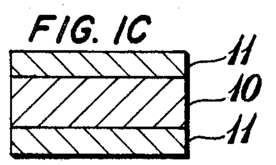
Figure 1D:
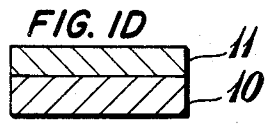
Figure 1E:
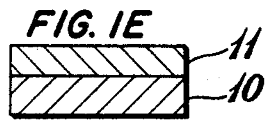

Since it is necessary to remove the diffused layer 11 from one side of the slice 10, in step 3 FIGURE 1C the slice 10 is tagged or marked in a suitable manner to indicate the diffused laver 11 to be removed. After being tagged, the slice 10 is lapped to remove the unwanted N+ layer 11 as shown in step 4 FIGURE 1D. The slice 10 after the lapping operation has been reduced in thickness to 10.5 mils and is ready for scribing as indicated by step 5 FIGURE 1E. After scribing the slice may be separated into a number of smaller wafers or dices 10.

Figure 1F:
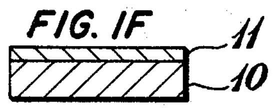
Figure 1G:
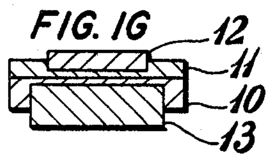

The dice 10 is now ready for etching as indicated by step 6 FIGURE 1F. The etching reduces the slice 10 to a predetermined thickness which for the example illustrated is 7.5 mils. Further, the N+ layer 11 has been reduced to 2 mils. The dice 10 is now ready for the alloying as indicated by step 7 FIGURE 1G. An emitter 12 and collector 13 of a suitable P type material are alloyed into the dice 10.

The aforenoted illustrates the present methods generally used and now reference is made to FIGURE 2 which illustrates the novel features of the present invention. In FIGURE 2, a slice of semiconductor material is indicated generally by the reference numeral 10A in step 1 FIGURE 2A and for the purpose of illustration is a slice N type germanium having a thickness of 10.5 mils.

Figure 2A:
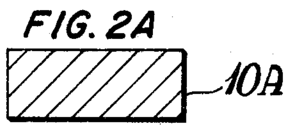
FIGURE 2 is a diagrammatical representation of the steps used in one embodiment of the invention.
Figure 2B:
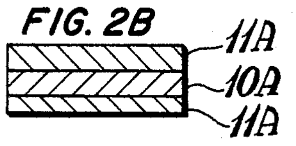
Figure 2C:
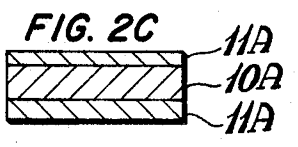
Figure 2D:
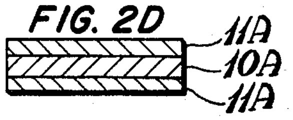

In step 2 of FIGURE 2B, the slice 10A is diffused to provise N+ layers 11A therein. The diffusion may be similar to that as set forth theretofore. For example, the diffusion will be to a depth of 3.5 mils in the slice 10A. The next step is the scribing as indicated by step 3 FIGURE 2C. After scribing, the slice may be cut up to form smaller slices of dice 10A. The dice 10A is etched to a predetermined thickness, which in the example illustrated is 7.5 mils. The N+ areas 11A are reduced to 2 mils as is shown in step 4 of FIGURE 2D.

Figure 2E:
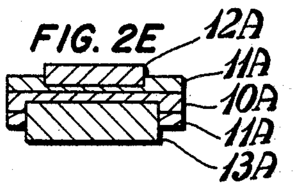
Figure 2F:
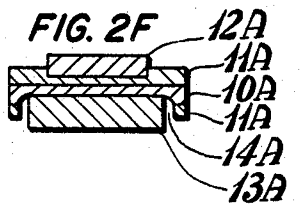
Figure 3A:
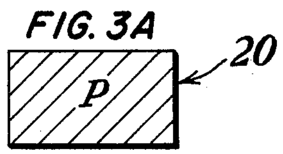
FIGURE 3 is a diagrammatical representation of the steps used in another embodiment of the invention.
Figure 3B:
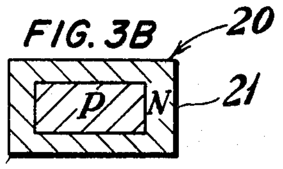
Figure 3C:
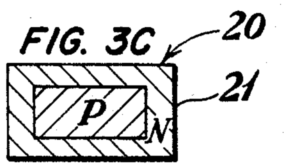
Figure 3D:
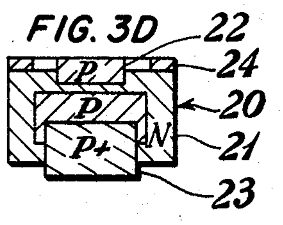
Figure 3E:
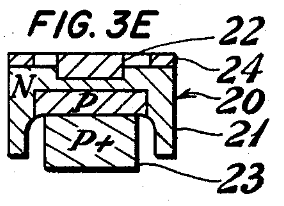

Next an emitter 12A and collector 13A are alloyed into the dice 10A as shown in step 5 of FIGURE 2E. The emitter 12A and collector 13A may be of any suitable P type material. It is noted that the collector is alloyed in beyond N+ layer 11A. The N+ material adjacent to the periphery of the collector 13A is removed as illustrated in step 6 of FIGURE 2F. The N+ material may be removed electrolytically or by chemical spray etching methods.

The characteristics of the transistors prepared by the method of FIGURE 1 and of FIGURE 2 are identical. The advantages of the method of FIGURE 2 is that there is a savings of one third the starting slice of semiconductor material. Further, it eliminates the necessity of tagging for identification and lapping. Lapping is a troublesome, slow and costly operation.

Referring now to FIGURE 3 in which another embodiment of the invention is disclosed. A single crystal of a semiconductor material is sliced and diced to a predetermined size. For purposes of illustration, the material may be of P type germanium having a thickness of .0075" and is indicated generally by the numeral 20 as shown in step 1 of FIGURE 3A. Next, in step 2 FIGURE 3B, N type impurities are diffused into the crystal or slice 20 in such a manner so as to provide an N+ impurity gradient 21 to a predetermined depth which for illustration is 0.0025. It is noted that the N+ layer surrounds the slice 20. In step 3 of FIGURE 3C, the slice is etched to a predetermined slice as determined by the design which for illustration is 0.0065.

The slice 20 is now ready for alloying a P type emitter 22 and a P+ type collector 23. The P+ collector 23 is alloyed through the N region 21 into the P region, see step 4 of FIGURE 3D. A base control 24 may be secured to the N region of the slice 20. Next in step 5 of FIGURE 3E, using electrolytic or etching, the N material surrounding the P+ collector is removed. The removal of the N material enables the collector junction to be active. Prior to the removal of the N material the collector would be shorted out. The N region remains on the sides of the slice 20. This method provides a fast switching PNP power transistor which utilizes a fully graded base layer, a diffused collector junction and the techniques used provide a new approach to transistor building.

Although only two embodiments of the invention have been illustrated and described, various changes in the form and relative arrangement of the parts, which will now appear to those skilled in the art, may be made without departing from the scope of the invention.

What is claimed is:

1. The method of fabricating a semiconductor device comprising selecting a slice of N type semiconductor material having a predetermined thickness, diffusing a layer of N+ material into both sides of said slice to a predetermined depth, etching said slice to reduce to a predetermined thickness, alloying a P type emitter into said N+ layer on one side of said slice, alloying a P type collector through said N+ layer on the other side, and etching to remove the N+ layer surrounding said collector to prevent shorting of said collector.

2. The method as set forth in claim 1 in which said semiconductor material is germanium.

3. The method as set forth in claim 1 in which said semiconductor material is silicon.

References Cited

UNITED STATES PATENTS

| | | | |
|---|---|---|---|
| 2,419,237 | 4/1947 | Treuting | 148—191 |
| 2,811,653 | 10/1957 | Moore | 148—177 |
| 2,868,683 | 1/1959 | Jochems | 148—177 |
| 2,910,634 | 10/1959 | Rutz | 148—177 |
| 3,245,848 | 4/1966 | De Vaux | 148—189 |
| 3,275,482 | 9/1966 | Meers | 148—179 |

HYLAND BIZOT, *Primary Examiner.*